United States Patent
Hara et al.

(10) Patent No.: US 9,303,788 B2
(45) Date of Patent: Apr. 5, 2016

(54) LOAD LOCK DEVICE

(71) Applicant: TOKYO ELECTRON LIMITED, Tokyo (JP)

(72) Inventors: Masamichi Hara, Nirasaki (JP); Tetsuya Miyashita, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 384 days.

(21) Appl. No.: 14/070,121

(22) Filed: Nov. 1, 2013

(65) Prior Publication Data

US 2014/0124069 A1    May 8, 2014

(30) Foreign Application Priority Data

Nov. 8, 2012 (JP) ................................ 2012-246327

(51) Int. Cl.
*F16K 51/02* (2006.01)
*H01L 21/67* (2006.01)

(52) U.S. Cl.
CPC .......... *F16K 51/02* (2013.01); *H01L 21/67201* (2013.01); *Y10T 137/86083* (2015.04)

(58) Field of Classification Search
CPC ............ H05K 13/0069; H05K 13/021; H05K 13/0456; B24B 37/32; B24B 49/16
See application file for complete search history.

(56) References Cited

U.S. PATENT DOCUMENTS

| | | | | |
|---|---|---|---|---|
| 6,110,011 A * | 8/2000 | Somekh | ............ | H01L 21/67161 257/E21.585 |
| 6,390,894 B1 * | 5/2002 | Beel | ......................... | B23F 5/02 409/27 |
| 6,435,941 B1 * | 8/2002 | White | ...................... | B23Q 7/04 451/285 |
| 7,455,575 B2 * | 11/2008 | Kim | ...................... | B24B 53/017 451/41 |
| 8,382,088 B2 * | 2/2013 | Kondoh | ............ | H01L 21/67769 118/719 |
| 2014/0124069 A1 * | 5/2014 | Hara | ....................... | F16K 51/02 137/565.23 |

FOREIGN PATENT DOCUMENTS

JP          11-87467 A      3/1999

* cited by examiner

*Primary Examiner* — Lee D Wilson
(74) *Attorney, Agent, or Firm* — Nath, Goldberg & Meyer; Jerald L. Meyer (57) ABSTRACT

Provided is a load lock device which includes: a container with an opening formed therein and configured to be selectively maintained at an atmospheric environment and a vacuum atmosphere; a holding unit arranged within the container and configured to hold objects to be processed; an elevation mechanism configured to vertically move the holding unit; and a pressure regulating mechanism configured to vacuum-evacuate the container through the opening of the container. The elevation mechanism includes at least two vertically-extended elevation shaft members connected to the holding unit; and a drive unit configured to vertically move the elevation shaft members. The elevation shaft members are arranged opposite each other with the opening interposed therebetween.

5 Claims, 7 Drawing Sheets

LOAD LOCK DEVICE

CROSS-REFERENCE TO RELATED APPLICATION

This application claims the benefit of Japanese Patent Application No. 2012-246327, filed on Nov. 8, 2012, in the Japan Patent Office, the disclosure of which is incorporated herein in its entirety by reference.

TECHNICAL FIELD

The present disclosure relates to a load lock device.

BACKGROUND

Load lock devices include a load lock chamber for holding semiconductor wafers and an elevation drive unit for moving the load lock chamber up and down. The load lock chamber is vertically movable within a container. In such a device, an elevation rod is connected to a central portion of the load lock chamber. The elevation rod extends outward from a central portion of the container such that it is connected to the elevation drive unit.

In a processing system provided with a load lock device, the process must be performed in a low-impurity environment. For this reason, the load lock device must have a high degree of vacuum to reduce impurities. In order to achieve a high degree of vacuum, a large-diameter exhaust port is necessary. It is however difficult to have a large-diameter exhaust port in the container because the elevation rod is connected to the central portion of the load lock chamber. In addition, the installation of the large-diameter exhaust port may cause an increase in size of the load lock device. If a plurality of exhaust ports is used, the complexity of the device may be increased.

SUMMARY

Some embodiments of the present disclosure provide a load lock device capable of rapidly realizing a high degree of vacuum with a simple configuration.

According to an embodiment of the present disclosure, provided is a load lock device which includes: a container with an opening formed therein and configured to be selectively maintained at an atmospheric environment and a vacuum atmosphere; a holding unit arranged within the container and configured to hold objects to be processed; an elevation mechanism configured to vertically move the holding unit; and a pressure regulating mechanism configured to vacuum-evacuate the container through the opening of the container. The elevation mechanism includes at least two vertically-extended elevation shaft members connected to the holding unit; and a drive unit configured to vertically move the elevation shaft members. The elevation shaft members are arranged opposite each other with the opening interposed therebetween.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments. Like reference numerals in the drawings denote like elements, and a duplicate description thereof will be omitted.

Figure 1:
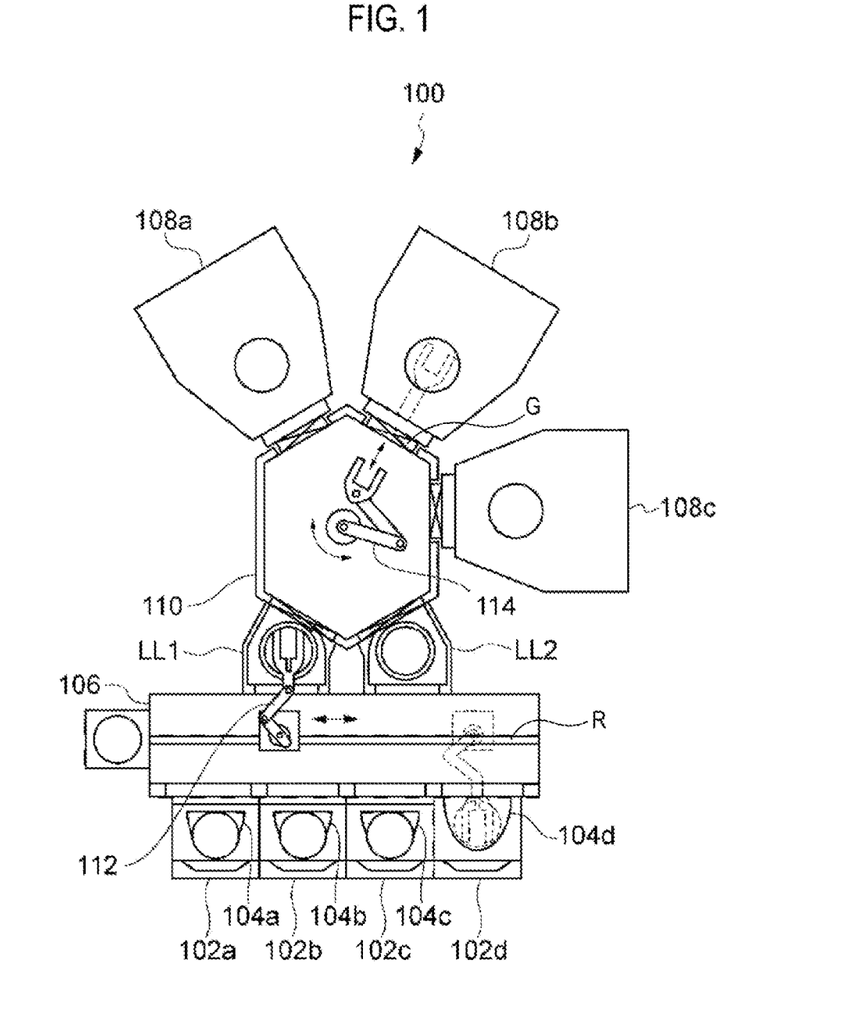
FIG. 1 is a top view showing a configuration of a processing system equipped with a load lock device according to one embodiment.

FIG. 1 is a top view showing a configuration of a processing system 100 equipped with a load lock device according to one embodiment. As shown in FIG. 1, the processing system 100 includes mounting tables 102a to 102d, receiving containers 104a to 104d, a loader module 106, load lock devices LL1 and LL2, process modules 108a to 108c and a transfer chamber 110.

The mounting tables 102a to 102d are arranged along one side of the loader module 106. The receiving containers 104a to 104d are respectively mounted on the mounting tables 102a to 102d. Semiconductor wafers W (objects to be processed) are accommodated within the receiving containers 104a to 104d.

A first transfer robot 112 is installed within the loader module 106 and is movable along a rail R. The first transfer robot 112 extracts the semiconductor wafers W accommodated within one of the receiving containers 104a to 104d and transfers the same to the load lock device LL1 or LL2.

The load lock devices LL1 and LL2 are installed along another side of the loader module 106. Each of the load lock devices LL1 and LL2 constitutes a preliminary depressurizing chamber. The load lock devices LL1 and LL2 are installed between the loader module 106 (kept in an atmospheric environment) and the transfer chamber 110 (a vacuum chamber) and are respectively connected to the transfer chamber 110 through gate valves G1 (see FIG. 3). The load lock devices LL1 and LL2 are, in this embodiment, independently connected to the loader module 106 through gate valves G2 and G3 (see FIG. 3).

The transfer chamber 110 is a chamber capable of being depressurized. A second transfer robot 114 is installed to be rotatable around its vertical axis within the transfer chamber 110. The process modules 108a to 108c are respectively connected to the transfer chamber 110 through a respective gate valve G. The second transfer robot 114 extracts the semiconductor wafers W from the load lock devices LL1 or LL2 and transfers the same to the process modules 108a to 108c one after another. Each of the process modules 108a to 108c of the processing system 100 may be, e.g., a physical vapor deposition (PVD) apparatus (sputtering apparatus), a chemical vapor deposition (CVD) apparatus, an etching apparatus or the like.

Figure 2:
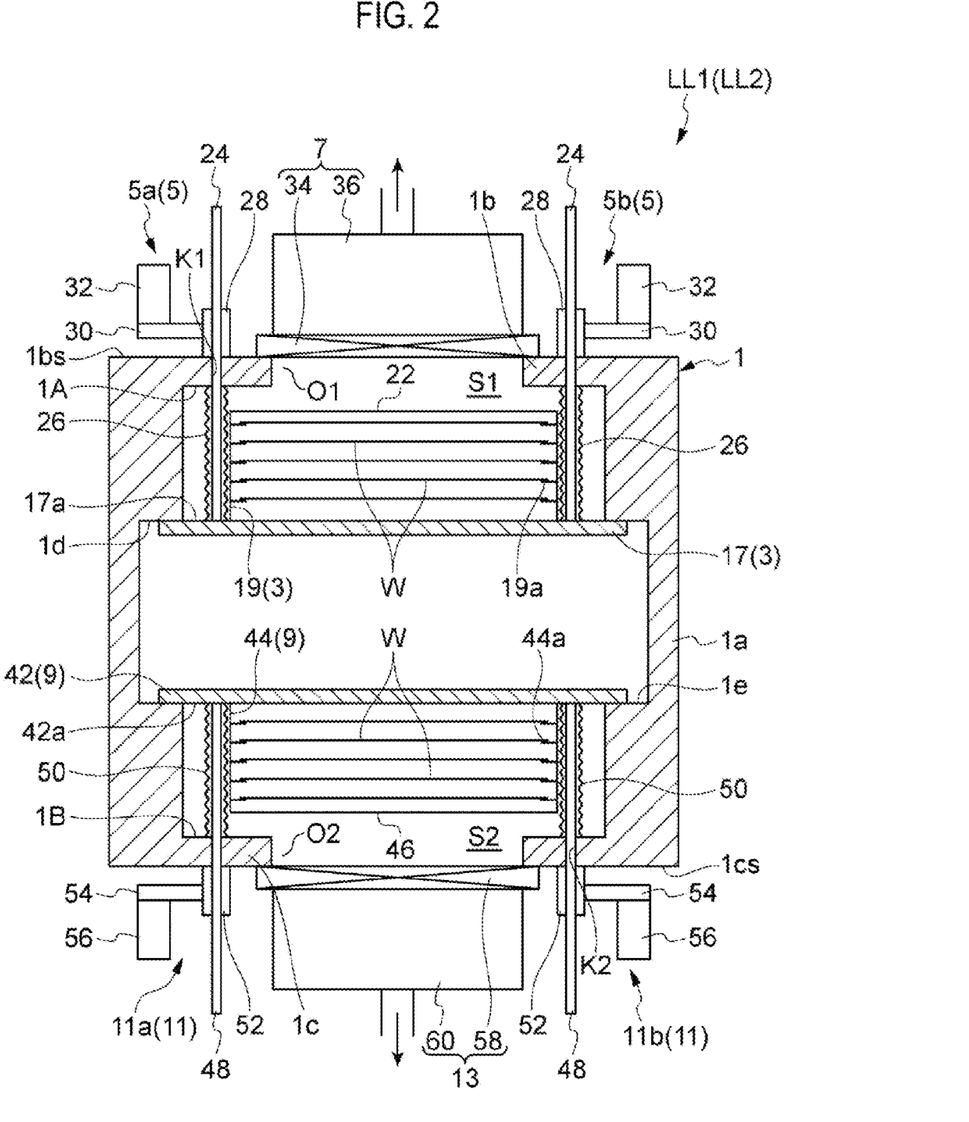
FIG. 2 is a view showing a cross-sectional configuration of the load lock device.
Figure 3:
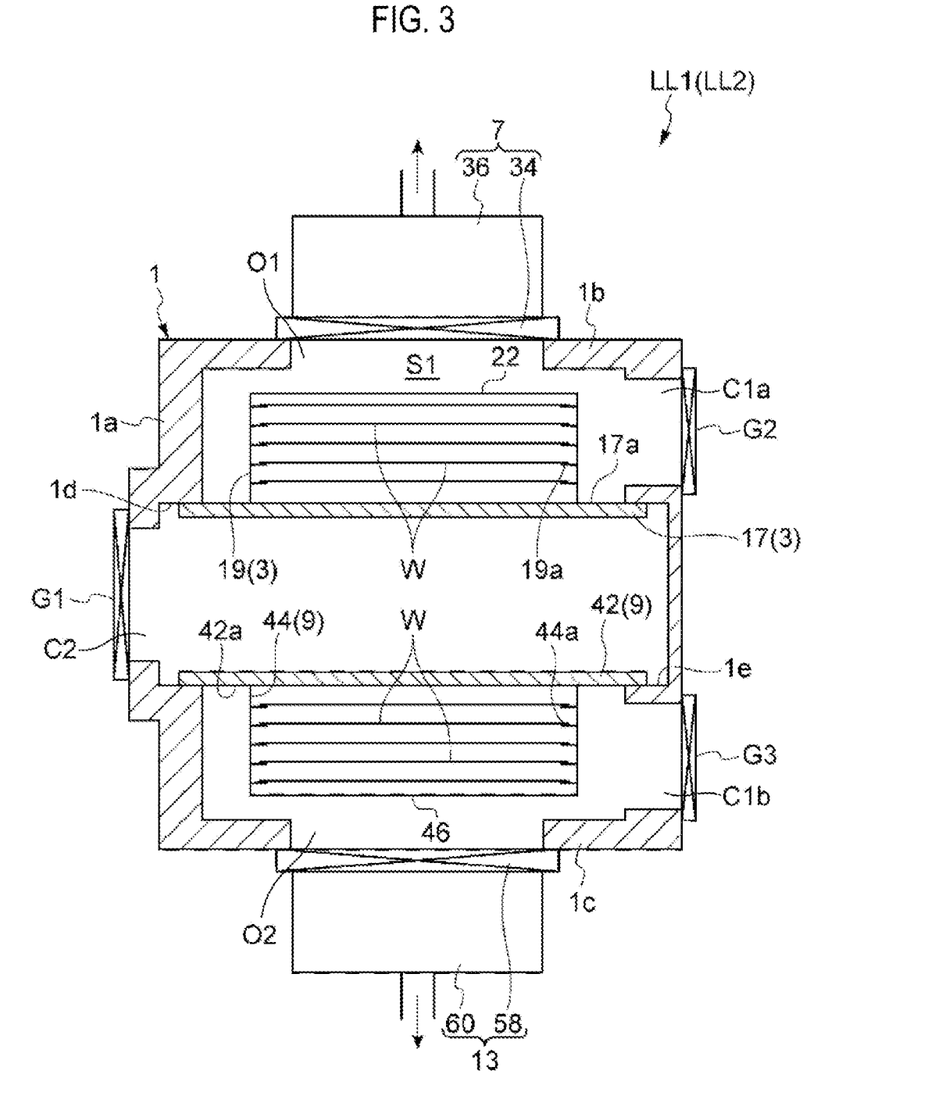
FIG. 3 is a view showing another cross-sectional configuration of the load lock device.
Figure 4:
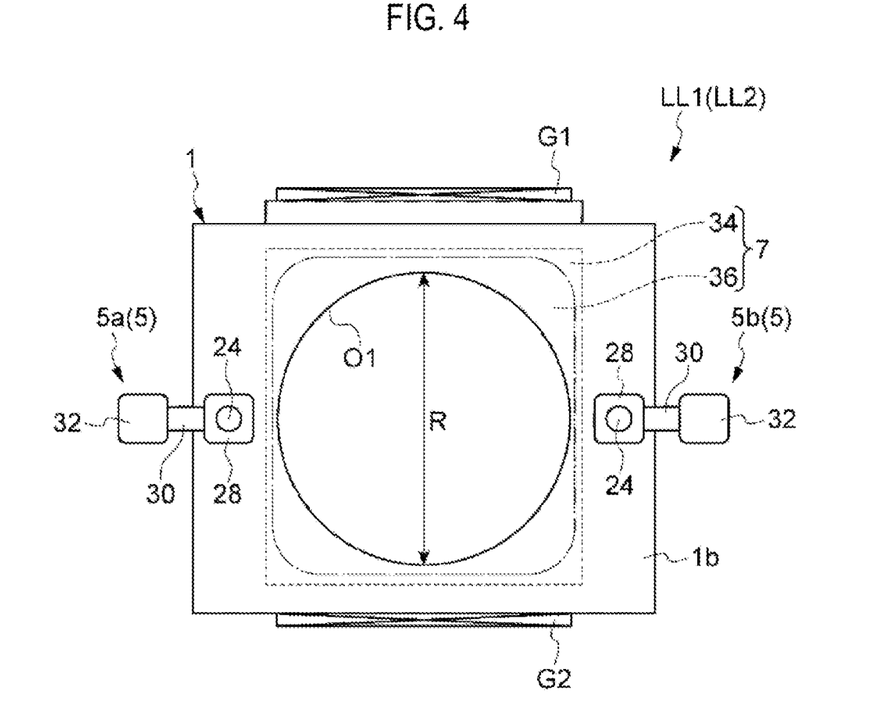
FIG. 4 is a schematic top view of the load lock device.
Figure 5:
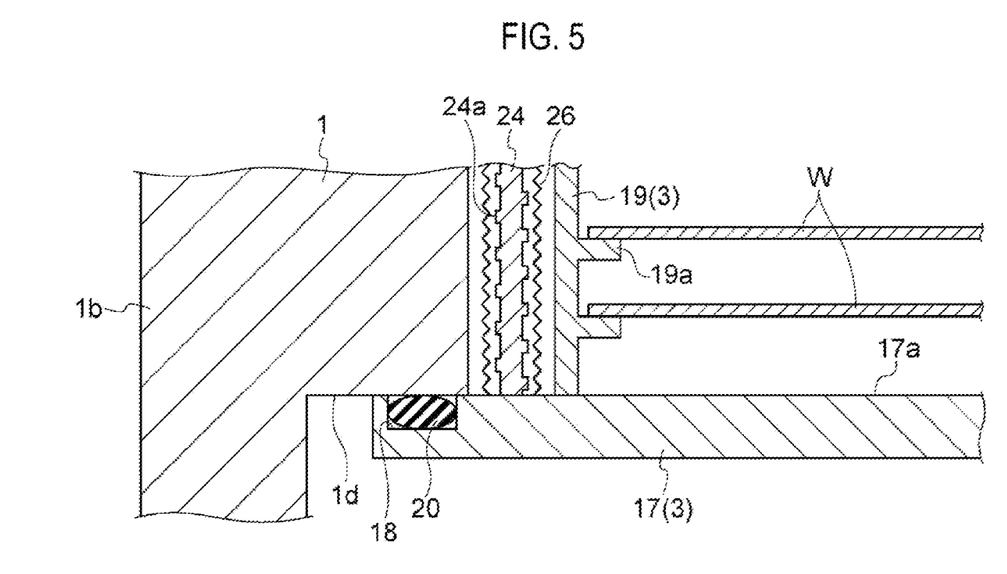
FIG. 5 is a partially enlarged sectional view of a first holding unit of the load lock device.
Figure 6:
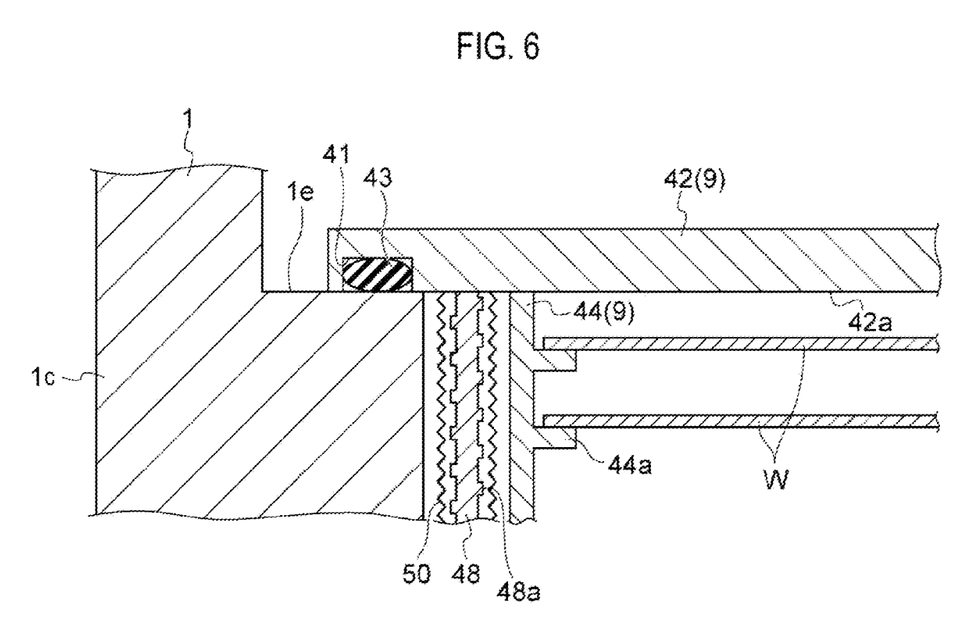
FIG. 6 is a partially enlarged sectional view of a second holding unit of the load lock device.

Next, the load lock devices LL1 and LL2 will be described in detail. The load lock device LL1 and the load lock device LL2 are identical in configuration with each other. In this embodiment, the load lock device LL1 will be described in detail as an example. FIG. 2 is a view showing a cross-sectional configuration of the load lock device LL1. FIG. 3 is a view showing another cross-sectional configuration of the load lock device LL1. FIG. 4 is a schematic top view of the load lock device LL1. FIG. 5 is a partially enlarged sectional view of a first holding unit provided in the load lock device LL1. FIG. 6 is a partially enlarged sectional view of a second holding unit provided in the load lock device LL1. Specifically, FIG. 2 is the cross-sectional view of the load lock device LL1 when viewed in a transfer direction of the semiconductor wafers W, and FIG. 3 is the cross-sectional view of the load lock device LL1 when viewed in a direction orthogonal to the transfer direction of the semiconductor wafers W.

As shown in FIGS. 2 to 4, the load lock device LL1 includes a chamber (container) 1, a first holding unit 3, a first elevation mechanism 5, a first pressure regulating mechanism 7, a second holding unit 9, a second elevation mechanism 11 and a second pressure regulating mechanism 13. The operation of the load lock device LL1 is controlled by a control unit (not shown).

The chamber 1 is configured such that an internal pressure thereof is changed between an internal pressure of the transfer chamber 110 and an atmospheric pressure. The chamber 1 is made of, e.g., an aluminum alloy or the like. As shown in FIG. 3, on a sidewall 1a of the chamber 1, there are formed inlet/outlets C1a and C1b through which the semiconductor wafers W are carried into or out of the chamber 1 by the first transfer robot 112 and an inlet/outlet C2 through which the semiconductor wafers W are carried into or out of the chamber 1 by the second transfer robot 114. The inlet/outlets C1a and C1b are respectively formed in upper and lower portions of the chamber 1 (i.e., in positions where the first holding unit 3 is positioned at the uppermost location and where the second holding unit 9 is positioned at the lowermost location). The inlet/outlets C1a and C1b are in communication with the loader module 106 through the gate valves G2 and G3. The inlet/outlet C2 is formed in the vertical central position of the chamber 1. The inlet/outlet C2 is in communication with the transfer chamber 110 through the gate valve G1.

A first opening O1 is formed in a ceiling portion 1b of the chamber 1. As shown in FIG. 4, the first opening O1 has a substantially circular shape and is positioned substantially at the center of the ceiling portion 1b of the chamber 1. The diameter R of the first opening O1 is substantially equal to that of the semiconductor wafer W.

A second opening O2 is formed in a bottom portion 1c of the chamber 1. The second opening O2 has a substantially circular shape and is positioned substantially at the center of the bottom portion 1c of the chamber 1. The diameter of the second opening O2 is substantially equal to that of the semiconductor wafer W.

First and second stepped portions 1d and 1e are formed at the inner side of the sidewall 1a of the chamber 1. The first and second stepped portions 1d and 1e are formed over the entire circumference within the chamber 1. The first and second stepped portions 1d and 1e are formed to face each other. The first stepped portion 1d is formed at the side of the ceiling portion 1b of the chamber 1. The second stepped portion 1e is formed at the side of the bottom portion 1c of the chamber 1.

The first holding unit 3 is arranged within the chamber 1 to hold the semiconductor wafers W. As an example, the first holding unit 3 is configured to hold five semiconductor wafers W. The first holding unit 3 is installed so that it can be vertically moved within the chamber 1 by the first elevation mechanism 5 (which will be described later). The first holding unit 3 includes a base portion 17 and a support portion 19.

The base portion 17 is a plate-like member and has a substantially circular shape when viewed from the top. A recess 18 (see FIG. 5) opened toward the ceiling portion 1b of the chamber 1 is formed in a peripheral region of the base portion 17. A seal member 20 is disposed in the recess 18. A periphery of an upper surface 17a of the base portion 17 is brought into contact with the first stepped portion 1d of the chamber 1. When the first holding unit 3 is positioned in the uppermost location, the base portion 17 is brought into contact with the first stepped portion 1d. The seal member 20 is disposed at a position where the seal member 20 is brought into contact with the first stepped portion 1d. Thus, a space S1 defined by the first holding unit 3 (or the base portion 17) and the chamber 1 is hermetically sealed.

The support portion 19 is installed on the base portion 17. The support portion 19 includes support pieces 19a protruding toward the center of the base portion 17. The semiconductor wafers W are mounted on the respective support pieces 19a so that they are supported by the support portion 19. The support portion 19 is positioned within the space S1 when the first holding unit 3 is positioned at the uppermost location. A cover 22 is arranged above the support portion 19.

The first elevation mechanism 5 is a mechanism configured to vertically move the first holding unit 3 and includes a first elevation unit 5a and a second elevation unit 5b. As shown in FIG. 4, the first elevation unit 5a and the second elevation unit 5b of the first elevation mechanism 5 are arranged in peripheral regions of the chamber 1 opposite each other with the first opening O1 of the chamber 1 interposed therebetween. The first elevation unit 5a and the second elevation unit 5b are identical in configuration with each other. As an example, a configuration of the first elevation unit 5a will be described in detail. The first elevation unit 5a includes a shaft (elevation shaft member) 24, bellows 26 (see FIGS. 2 and 5), a nut 28, a transfer shaft 30 and a motor 32. The nut 28, the transfer shaft 30 and the motor 32 constitute a first drive unit.

The shaft 24 is a rod-like member, which serves as a threaded shaft on which a male thread (see FIG. 5) is formed. The shaft 24 is inserted into a through-hole K1 formed in the ceiling portion 1b of the chamber 1 such that it is disposed across inside and outside of the chamber 1. The shaft 24 is connected to the base portion 17 of the first holding unit 3. The shaft 24 is connected to the peripheral region of the base portion 17 at a location positioned more inward than the recess 18. In some embodiments, the shaft 24 and the base portion 17 may be connected to each other by, e.g., forming a through-hole in the base portion 17, inserting the shaft 24 into the through-hole and fastening them by a bolt (not shown). The length of the shaft 24 is set such that the first holding unit 3 can travel between the inlet/outlet C1a and the inlet/outlet C2.

The motor 32 is connected to the shaft 24 through the transfer shaft 30. The shaft 24 is rotated in conjunction with the rotation of the motor 32. By the rotation of the shaft 24, the first elevation mechanism 5 moves the first holding unit 3 up and down. The operation of the motor 32 is controlled by the control unit.

The bellows 26 is a tubular member having a bellows structure. The shaft 24 is arranged to extend through the bellows 26. The bellows 26 has flexibility, air-tightness and resiliency. The bellows 26 extends and retracts along with the vertical movement of the first holding unit 3. An upper end of the bellows 26 is air-tightly joined to a ceiling surface 1A of the chamber 1. A lower end of the bellows 26 is air-tightly joined to an upper surface 17a of the base portion 17.

A female thread is formed on an inner surface of the nut 28 and balls are arranged on the inner surface of the nut 28. The nut 28 is coupled with the shaft 24. The nut 28 and the shaft 24 constitute a ball screw. The nut 28 is arranged in a peripheral region of the ceiling portion 1b of the chamber 1.

The first pressure regulating mechanism 7 includes a gate valve 34 and a vacuum pump 36. The gate valve 34 is arranged on an upper surface 1bs of the chamber 1. The gate valve 34 is arranged to cover the first opening O1 of the chamber 1. An opening/closing operation of the gate valve 34 is controlled by the control unit.

The vacuum pump 36 is installed on the gate valve 34. The vacuum pump 36 is configured to depressurize the space S1 defined by the chamber 1 and the first holding unit 3. The vacuum pump 36 is a pump capable of realizing a vacuum degree of, e.g., $10^{-7}$ to $10^{-8}$ Torr. Upon opening the gate valve 34, the vacuum pump 36 performs the depressurization (or vacuum-evacuation) operation to maintain the space Si defined by the first holding unit 3 and the chamber 1 at a predetermined degree of vacuum. The first pressure regulating mechanism 7 may further include a configuration in which an internal state of the space S1 is returned from a vacuum environment to an atmospheric environment.

The second holding unit 9 is arranged within the chamber 1 to hold the semiconductor wafers W. As an example, the second holding unit 9 is configured to hold five semiconductor wafers W. The second holding unit 9 is installed so that it can be vertically moved within the chamber 1 by the second elevation mechanism 11 (which will be described later). The second holding unit 9 includes a base portion 42 and a support portion 44.

The base portion 42 is a plate-like member and has a substantially circular shape when viewed from the top. A recess 41 (see FIG. 6) opened toward the bottom portion 1c of the chamber 1 is formed in a peripheral region of the base portion 42. A seal member 43 is disposed in the recess 41. A lower surface 42a of the base portion 42 is brought into contact with the second stepped portion 1e of the chamber 1. When the second holding unit 9 is positioned in the lowermost location, the base portion 42 is brought into contact with the second stepped portion 1e. The seal member 43 is disposed in a position where the seal member 43 is brought into contact with the second stepped portion 1e. Thus, a space S2 defined by the second holding unit 9 (or the base portion 42) and the chamber 1 is hermetically sealed.

The support portion 44 is installed on the base portion 42. The support portion 44 includes support pieces 44a protruding toward the center of the base portion 42. The semiconductor wafers W are mounted on the respective support pieces 44a so that they are supported by the support portion 44. The support portion 44 is positioned within the space S2 when the second holding unit 9 is positioned in the lowermost location. A cover 46 is arranged below the support portion 44.

The second elevation mechanism 11 is a mechanism configured to vertically move the second holding unit 9. The second elevation mechanism 11 is arranged in the peripheral regions of the chamber 1 and includes a first elevation unit 11a and a second elevation unit 11b positioned opposite each other with the second opening O2 of the chamber 1 interposed therebetween. The first elevation unit 11a and the second elevation unit 11b are identical in configuration with each other. As an example, a configuration of the first elevation unit 11a will be described in detail. The first elevation unit 11a includes a shaft (elevation shaft member) 48, a bellows 50, a nut 52, a transfer shaft 54 and a motor 56. The nut 52, the transfer shaft 54 and the motor 56 constitute a second drive unit.

The shaft 48 is a rod-like member, which serves as a threaded shaft on which a male thread (see FIG. 6) is formed. The shaft 48 is inserted into a through-hole K2 formed in the bottom portion 1c of the chamber 1 so that it is disposed across inside and outside of the chamber 1. The shaft 48 is connected to the base portion 42 of the second holding unit 9. The shaft 48 is connected to the peripheral region of the base portion 42 at a location positioned more inward than the recess 41. In some embodiments, the shaft 48 and the base portion 42 may be connected to each other by, e.g., forming a through-hole in the base portion 42, inserting the shaft 48 into the through-hole and fastening them by a bolt (not shown). The length of the shaft 48 is set such that the second holding unit 9 can travel between the inlet/outlet C1b and the inlet/outlet C2.

The motor 56 is connected to the shaft 48 through the transfer shaft 54. The shaft 48 is rotated in conjunction with the rotation of the motor 56. By the rotation of the shaft 48, the second elevation mechanism 11 moves the second holding unit 9 up and down. An operation of the motor 56 is controlled by the control unit.

The bellows 50 is a tubular member having a bellows structure. The shaft 48 is arranged to extend through the bellows 50. The bellows 50 has flexibility, air-tightness and resiliency. The bellows 50 extends and retracts along with the vertical movement of the second holding unit 9. An upper end of the bellows 50 is air-tightly joined to a lower surface 42a of the base portion 42. A lower end of the bellows 50 is air-tightly joined to a bottom surface 1B of the chamber 1.

A female thread is formed on an inner surface of the nut 52 and balls are arranged on the inner surface of the nut 52. The nut 52 is coupled with the shaft 48. The nut 52 and the shaft 48 constitute a ball screw. The nut 52 is arranged in the peripheral region of the bottom portion 1c of the chamber 1.

The second pressure regulating mechanism 13 includes a gate valve 58 and a vacuum pump 60. The gate valve 58 is arranged on a lower surface 1cs of the chamber 1. The gate valve 58 is arranged to cover the second opening O2 of the chamber 1. An opening/closing operation of the gate valve 58 is controlled by the control unit.

The vacuum pump 60 is installed on the gate valve 58. The vacuum pump 60 is configured to depressurize the space S2 defined by the chamber 1 and the second holding unit 9. The vacuum pump 60 is a pump capable of realizing a vacuum degree of, e.g., $10^{-7}$ to $10^{-8}$ Torr. Upon opening the gate valve 58, the vacuum pump 60 performs the depressurization (or vacuum-evacuation) operation to maintain the space S2 defined by the second holding unit 9 and the chamber 1 at a predetermined degree of vacuum. The second pressure regulating mechanism 13 may further include a configuration in which an internal state of the space S2 is returned from a vacuum environment to an atmospheric environment.

Next, a description will be made of one example of the operation of the processing system 100 equipped with the load lock device LL1. In the processing system 100, a carrier in which a predetermined number of semiconductor wafers W to be processed are accommodated, is received within the respective receiving containers 104a to 104d. Then, the first transfer robot 112 moves just in front of, e.g., the receiving container 104*d* (see FIG. 1), and extracts a semiconductor wafer W from the receiving container 104*d*. Subsequently, the first transfer robot 112 transfers the extracted semiconductor wafer W to the front of the load lock device LL1.

In parallel with the aforementioned operation, the gate valve G2 of the load lock device LL1 is opened such that an interior of the chamber 1 is set to be an atmospheric environment. At this time, in the load lock device LL1, the first holding unit 3 waits at a position corresponding to the inlet/outlet C1*a*. If the gate valve G2 is opened, the first transfer robot 112 transfers the extracted semiconductor wafer W to the first holding unit 3. In this way, the first transfer robot 112 transfers the five semiconductor wafers W.

Thereafter, in the load lock device LL1, the gate valve G2 is closed and the gate valve 34 of the first pressure regulating mechanism 7 is opened. The space S1 is kept at a predetermined degree of vacuum by the vacuum pump 36. Subsequently, in the load lock device LL1, the first elevation mechanism 5 moves the first holding unit 3 down to a position corresponding to the inlet/outlet C2.

Then, in the load lock device LL1, the gate valve G1 is opened if the first holding unit 3 is moved down to the position corresponding to the inlet/outlet C2. Thus, the space 51 of the load lock device LL1 communicates with the transfer chamber 110. Subsequently, the second transfer robot 114 extracts the semiconductor wafer W from the first holding unit 3 and transfers the same to, e.g., the process module 108*b* (see FIG. 1). The process module 108*b* performs a predetermined process onto the semiconductor wafer W.

After all the semiconductor wafers W are extracted from the first holding unit 3 in the above way, the first elevation mechanism 5 of the load lock device LL1 moves the first holding unit 3 upward such that the first holding unit 3 is positioned in the uppermost position (near the inlet/outlet C1*a*). Then, in the load lock device LL1, the first pressure regulating mechanism 7 returns the internal state of the space 51 to an atmospheric environment. In the load lock device LL1, the aforementioned operation is repeatedly carried out.

If the predetermined process for the semiconductor wafers W is carried out by the process modules 108*a* to 108*c*, the second elevation mechanism 11 of the load lock device LL1 moves the second holding unit 9 upward, whereby the second holding unit 9 waits at the position corresponding to the inlet/outlet C2. Then, the gate valve G1 of the load lock device LL1 is opened so that the chamber 1 communicates with the transfer chamber 110. Subsequently, the second transfer robot 114 transfers the processed semiconductor wafers W to the second holding unit 9.

If the transfer of the semiconductor wafers W using the second transfer robot 114 is finished, the second holding unit 9 is moved downward by the second elevation mechanism 11 of the load lock device LL1. If the second holding unit 9 is positioned in the lowermost location (near the inlet/outlet C1*b*), the internal state of the space S2 is returned to an atmospheric environment by the second pressure regulating mechanism 13. Thereafter, the gate valve G3 is opened. Thus, the chamber 1 is under an atmospheric environment (i.e., communicates with the loader module 106). Then, the first transfer robot 112 extracts the semiconductor wafers W from the second holding unit 9 and transfers the same to, e.g., the receiving container 104*a*.

As described above, in this embodiment, the first opening O1 and the second opening O2, each of which is in communication with the inside of the chamber 1, are formed in the ceiling portion 1*b* and the bottom portion 1*c* of the chamber 1, respectively. The pair of the shafts 24 (and 48) used in vertically moving the first holding unit 3 (and the second holding unit 9) is arranged opposite each other with the first opening O1 (and the second opening O2) interposed therebetween.

This configuration allows regions for the formation of the first opening O1 and the second opening O2 to be obtained in the chamber 1. This makes it possible to increase the diameter of the first opening O1 and the second opening O2. It is therefore possible to rapidly realize a high degree of vacuum in the spaces S1 and S2 using the first and second pressure regulating mechanisms 7 and 13. Further, since the aforementioned configuration of the present disclosure can be applied to a conventional device, it is possible to prevent the conventional device from becoming large and complex. Accordingly, in the load lock devices LL1 and LL2, a high degree of vacuum can be rapidly realized with a simple configuration.

In this embodiment, the shafts 24 and 48 are respectively connected (joined) to the base portions 17 and 42. In the configuration that maintains the spaces S1 and S2 defined by each of the base portions 17 and 42 and the chamber 1 at a vacuum state, it is necessary to secure air-tightness of the spaces S1 and S2 defined by the chamber 1 and each of the base portions 17 and 42. To do this, it is required to bring each of the base portions 17 and 42 and the chamber 1 into close contact with each other. Thus, a force for bringing each of the base portions 17 and 42 and the chamber 1 into close contact with each other needs to be sufficiently transferred from the shafts 24 and 48 to the base portions 17 and 42, respectively. For that reason, the base portions 17 and 42 need to be made rigid. Unfortunately, this increases the thickness of each of the base portions 17 and 42. In this embodiment, the shafts 24 and 48 are respectively connected to the base portions 17 and 42. Thus, the force for bringing each of the base portions 17 and 42 and the chamber 1 into close contact with each other can be stably transferred from the shafts 24 and 48 to the base portions 17 and 42, respectively. This reduces the thickness of each of the base portions 17 and 42, which makes it possible to reduce the size of the apparatus.

As described above, each of the load lock devices LL1 and LL2 includes the first holding unit 3 and the second holding unit 9. With this configuration, for example, the semiconductor wafers W can be supplied to the transfer chamber 110 using the second holding unit 9 while the first holding unit 3 holds the semiconductor wafers W in the atmospheric environment. This enables the load lock devices LL1 and LL2 to perform two processes in parallel, which increases the processing efficiency.

Figure 7:
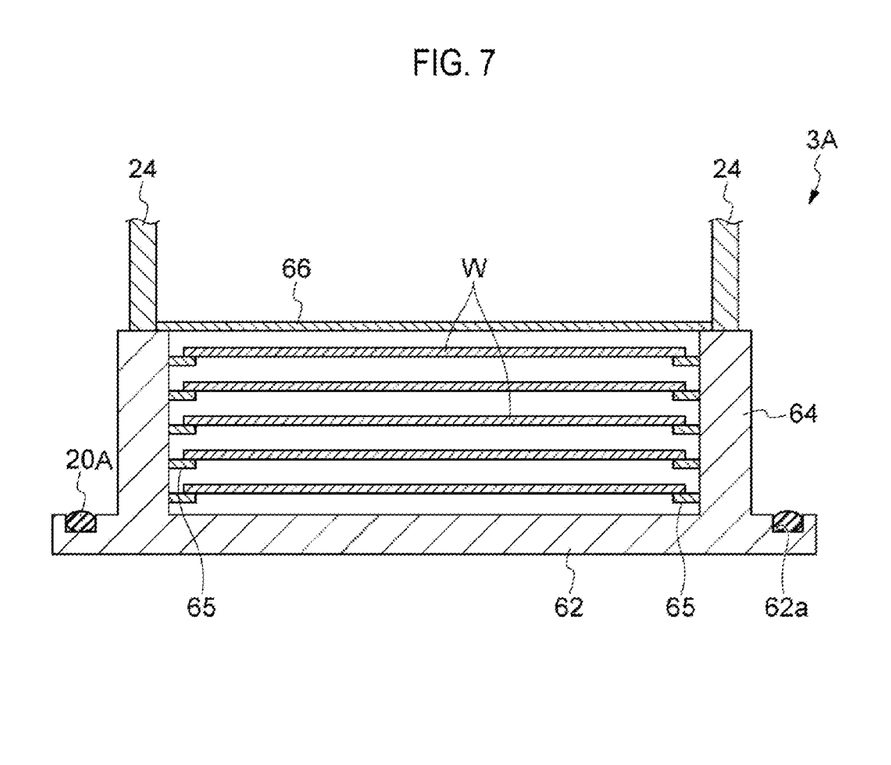
FIG. 7 is a view showing a cross-sectional configuration of a holding unit of a load lock device according to another embodiment.

The present disclosure is not limited to the above embodiment. In some embodiments, the first holding unit 3 may be implemented with a configuration shown in FIG. 7. FIG. 7 is a view showing a cross-sectional configuration of a holding unit of a load lock device according to another embodiment. As shown in FIG. 7, a first holding unit 3A includes a base portion 62 having a substantially circular shape when viewed from the top, a vertical wall 64 installed upright on the base portion 62, and support parts 65 installed in the vertical wall 64. A recess 62*a* is formed in a peripheral region of the base portion 62. A seal member 20A is arranged in the recess 62*a*. A cover 66 is installed above the vertical wall 64.

In the first holding unit 3A, the shafts 24 may be connected to the vertical wall 64. Alternatively, the shafts 24 may be connected to the base portion 62 through the vertical wall 64. In some embodiments, from the viewpoint of close contact of the base portion 62 and the chamber 1, the shafts 24 may be connected to the base portion 62.

While in the above embodiment, each of the first opening O1 and the second opening O2 has been described to be formed in the central region of each of the ceiling portion 1*b* and the bottom portion 1*c* of the chamber 1, the present disclosure is not limited thereto. Alternatively, each of the first opening O1 and the second opening O2 may be formed in a position offset from the central region of each of the ceiling portion 1b and the bottom portion 1c.

In some embodiments, a mechanism configured to heat and cool the semiconductor wafers W may be installed in each of the first holding unit 3 and the second holding unit 9.

While in the above embodiment, each of the load lock devices LL1 and LL2 has been described to be connected to the transfer chamber 110 via the gate valve G1, but is not limited thereto. In some embodiments, the gate valve G1 may be omitted.

According to the present disclosure, it is possible to rapidly realize a high degree of vacuum with a simple configuration.

While certain embodiments have been described, these embodiments have been presented by way of example only, and are not intended to limit the scope of the disclosures. Indeed, the novel devices described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A load lock device, comprising:
   a container with an opening formed therein and configured to be selectively maintained at an atmospheric environment and a vacuum atmosphere;
   a holding unit arranged within the container and configured to hold objects to be processed;
   an elevation mechanism configured to vertically move the holding unit; and
   a pressure regulating mechanism configured to vacuum-evacuate the container through the opening of the container,
   wherein the elevation mechanism includes:
   at least two vertically-extended elevation shaft members connected to the holding unit; and
   a drive unit configured to vertically move the elevation shaft members,
   wherein the elevation shaft members are arranged opposite each other with the opening interposed therebetween.

2. The device of claim 1, wherein the holding unit includes a support portion configured to support the objects to be processed and a base portion on which the support portion is installed,
   wherein the pressure regulating mechanism is configured to maintain a space defined by the base portion and the container at a vacuum state, and
   wherein the elevation shaft members are connected to the base portion.

3. The device of claim 1, wherein the holding unit includes an upper holding unit and a lower holding unit, the upper holding unit being located in an upper portion of the container and the lower holding unit being located in a lower portion of the container;
   wherein the elevation mechanism includes an upper elevation mechanism and a lower elevation mechanism which are used for the upper holding unit and the lower holding unit,
   wherein the opening includes an upper opening and a lower opening, and
   wherein the pressure regulating mechanism includes an upper pressure regulating mechanism and a lower pressure regulating mechanism, each of which is located in positions corresponding to the upper opening and the lower opening of the container.

4. The device of claim 1, wherein the drive unit includes a first drive unit located proximate to a first elevation shaft member of the at least two elevation shaft members and a second drive unit located proximate to a second elevation shaft member of the at least two elevation shaft members.

5. The device of claim 1, wherein the opening has an inner diameter substantially equal to an outer diameter of the object to be processed.

* * * * *